US008804329B2

(12) United States Patent
Li

(10) Patent No.: US 8,804,329 B2
(45) Date of Patent: Aug. 12, 2014

(54) COMPUTER SYSTEM INCLUDING A HEAT DISSIPATING APPARATUS

(75) Inventor: Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 493 days.

(21) Appl. No.: 13/172,292

(22) Filed: Jun. 29, 2011

(65) Prior Publication Data

US 2012/0113580 A1 May 10, 2012

(30) Foreign Application Priority Data

Nov. 4, 2010 (CN) .......................... 2010 1 0531879

(51) Int. Cl.
*H05K 7/20* (2006.01)
*G06F 1/20* (2006.01)
(52) U.S. Cl.
CPC .............. *G06F 1/20* (2013.01); *H05K 7/20145* (2013.01); *H05K 7/20972* (2013.01); *G06F 2200/1631* (2013.01); *G02F 2201/36* (2013.01)
USPC ................. 361/679.49; 361/695; 361/679.47; 361/692; 174/548
(58) Field of Classification Search
CPC ... G06F 1/20; G06F 1/181; G06F 2200/1631; H05K 7/20145; H05K 7/20972; H01L 23/467; G02F 1/133385; G02F 2201/36
USPC ....................... 361/679.46–679.54, 688–723; 165/80.2–80.3; 257/712–713, 257/721–722; 174/16.1, 16.3, 548; 454/184; 353/61; 362/373, 218, 264, 362/294; 349/161
See application file for complete search history.

(56) References Cited

U.S. PATENT DOCUMENTS

| | | | |
|---|---|---|---|
| 6,104,451 A * | 8/2000 | Matsuoka et al. ............... 349/58 |
| 7,447,018 B2 * | 11/2008 | Lee et al. ....................... 361/695 |
| 7,800,706 B2 * | 9/2010 | Kim et al. ........................ 349/58 |
| 8,237,652 B2 * | 8/2012 | Kim ............................... 345/102 |
| 2008/0089028 A1 * | 4/2008 | Kim et al. ...................... 361/695 |
| 2010/0027220 A1 * | 2/2010 | Hughes et al. ................. 361/702 |
| 2010/0321887 A1 * | 12/2010 | Kwon et al. .................. 361/695 |
| 2012/0044641 A1 * | 2/2012 | Zhu et al. ....................... 361/692 |
| 2013/0003300 A1 * | 1/2013 | Fu et al. ......................... 361/697 |
| 2013/0027876 A1 * | 1/2013 | Chao et al. .................... 361/690 |
| 2013/0033816 A1 * | 2/2013 | Fu ............................. 361/679.47 |

* cited by examiner

*Primary Examiner* — Zachary M Pape
(74) *Attorney, Agent, or Firm* — Novak Druce Connolly Bove + Quigg LLP

(57) ABSTRACT

A computer system includes a computer case, a cover, and an air duct. The computer case includes a display, a housing connected to the display. A motherboard is attached to the housing, and a fan module. The motherboard includes a heat generating component. A first input opening and an output opening is defined in the cover. The output opening corresponds to the fan module. The air duct is mounted on the heat generating component. A plurality first holes are defined in the air duct corresponding to the heat generating component. The air duct corresponds to the first input opening to guide air to flow to the heat generating component via the first input opening and the plurality of first holes.

9 Claims, 5 Drawing Sheets

COMPUTER SYSTEM INCLUDING A HEAT DISSIPATING APPARATUS

BACKGROUND

1. Technical Field

The present disclosure relates to computer systems, more particularly to a computer system with a heat dissipating apparatus.

2. Description of Related Art

Heat dissipating devices perform the critical function of removing heat from a computer system. For example, a plurality of fans may be provided to efficiently dissipate heat. Air is directed out of the computer system by the fan, for dissipating heat generated in the computer system. However, the air flows in a disorderly manner in the computer system, which makes the heat dissipating efficiency of the computer system decrease.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
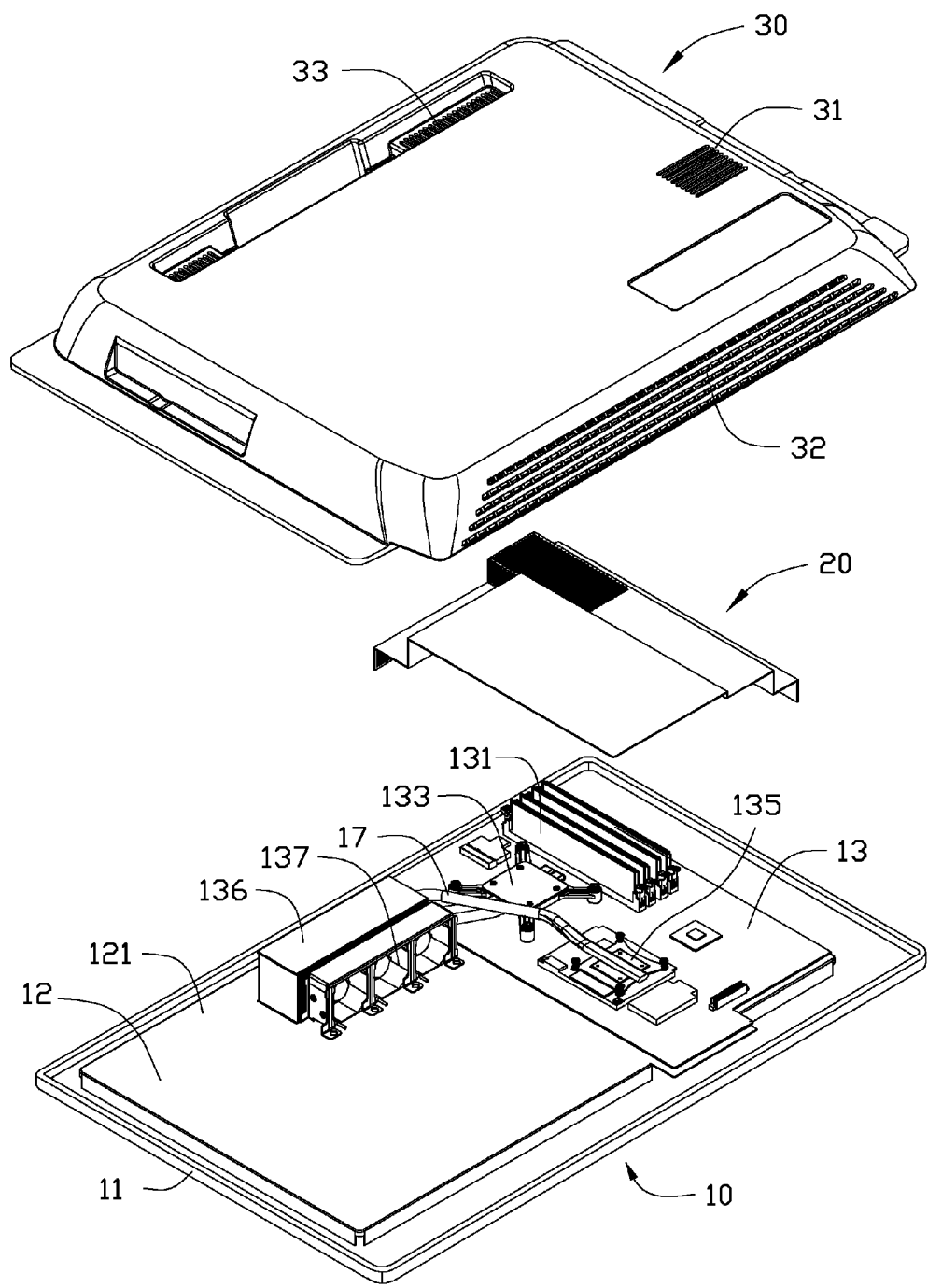
FIG. 1 is an exploded, isometric view of a computer system in accordance with an exemplary embodiment.

Referring to FIG. 1, a computer system in accordance with an exemplary embodiment includes a computer case 10, an air duct 20, and a cover 30 attached to the computer case 10. In one exemplary embodiment, the computer system can be an all-in-one.

The computer base includes a display 11, a housing 12 connected to the display 11, and a motherboard 13 mounted on the housing 12. The display 11 is secured to a first side of the housing 12, and the motherboard 13 is attached to a second side of the housing 12 opposite to the first side.

The housing 12 includes a bottom panel 121. The motherboard 13 includes various components. The components include a plurality of memory cards 131, a first heat dissipating device 133 is mounted on a CPU (not shown), and a second heat dissipating device 135 is mounted on a graphics card (not shown). A heat sink 136 and a fan module 137 are mounted in the middle of the housing 12. A plurality of heat pipes 17 are connected between the first heat dissipating device 133 and the heat sink 136. A plurality of heat pipes 17 are also connected between the second heat dissipating device 135 and the heat sink 136.

Figure 2:
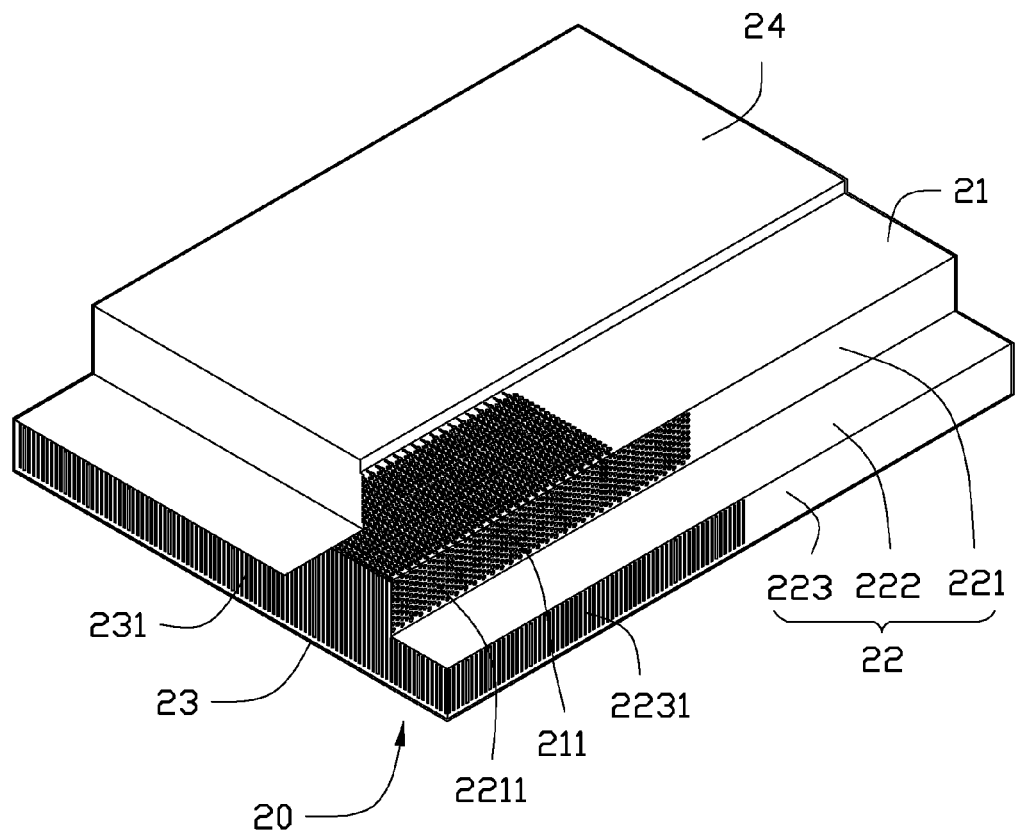
FIG. 2 is an isometric view of an air duct of FIG. 1.

Referring to FIG. 2, the air duct 20 includes a top plate 21 substantially parallel to the motherboard 13, a side portion 22 extending from the top plate 21, and a first side plate 23 extending from the side portion 22. The side portion 22 is substantially step-shaped. The side portion 22 includes a second side plate 221 extending substantially perpendicularly from the top plate 21, a connecting plate 222 substantially perpendicularly extending from the second side plate 221, and a third side plate 223 extending from the connecting plate 222. The first side plate 23 is substantially perpendicular to the top plate 21 and the second plate 221. A plurality of circular first holes 211 are defined in the top plate 21 corresponding to the memory cards 131. A plurality of elongated second holes 231 are defined in the first side panel 23. A plurality of circular third holes 2211 are defined in the second side plate 221. A plurality of elongated fourth holes 2231 are defined in the third side plate 223. The air duct 20 further includes a resisting plate 24 extending from the top plate 21. The resisting plate 24 resists the cover 30 to keep a space between the cover 30 and the connecting plate 222, allowing air to easily flow into the air duct 20. The second side plate 221 is substantially perpendicular to an extending direction of the memory cards 131.

A first input opening 31 is defined in the cover 30 corresponding to the top plate 21. A second input opening 32 is defined in one side of the cover 30 and an output opening 33 is defined in another side of the cover 30 corresponding to the heat sink 136.

Figure 3:
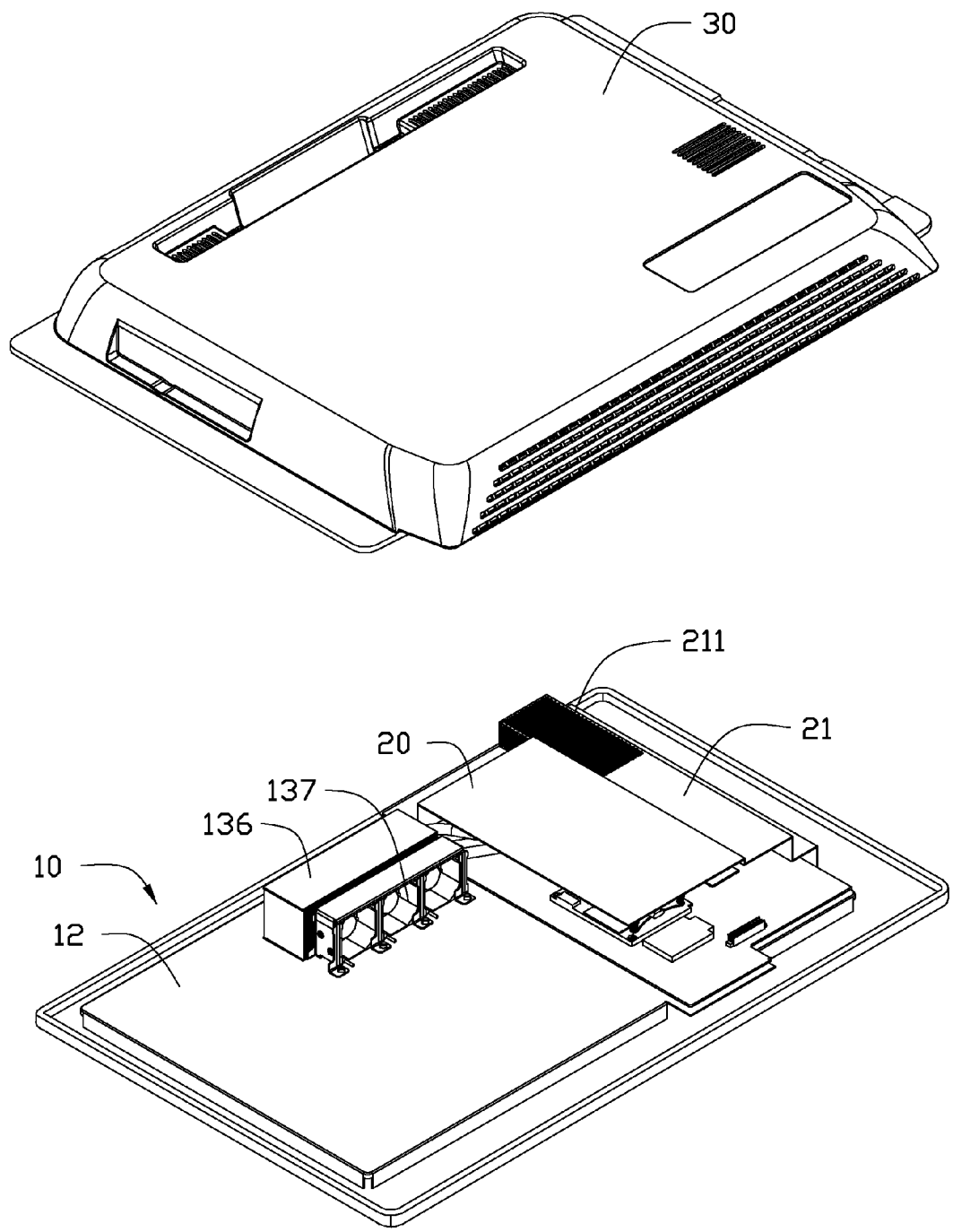
FIG. 3 is exploded, isometric view of FIG. 1 when the air duct assembled to a computer case.
Figure 4:
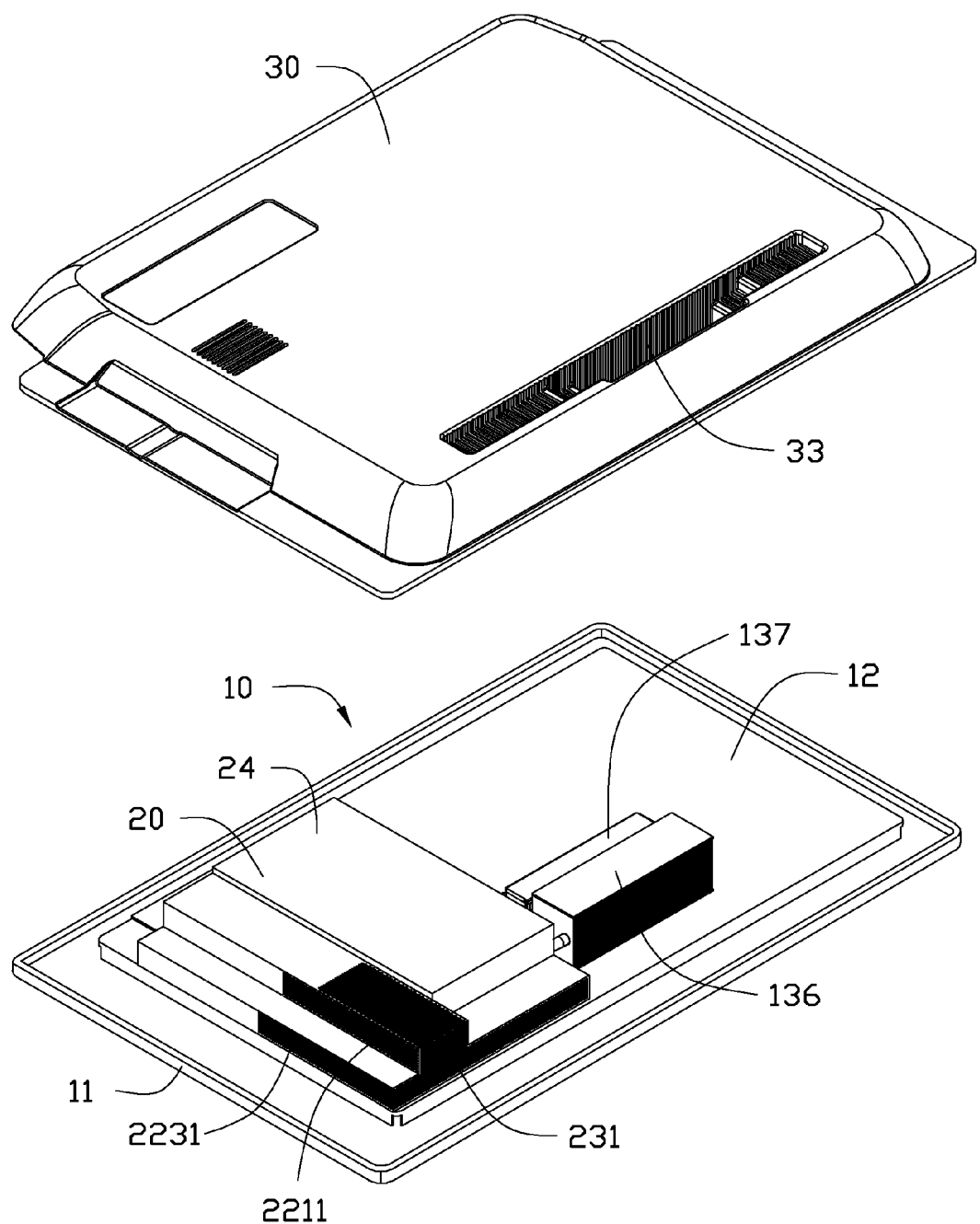
FIG. 4 is similar to FIG. 3, but viewed in another aspect.
Figure 5:
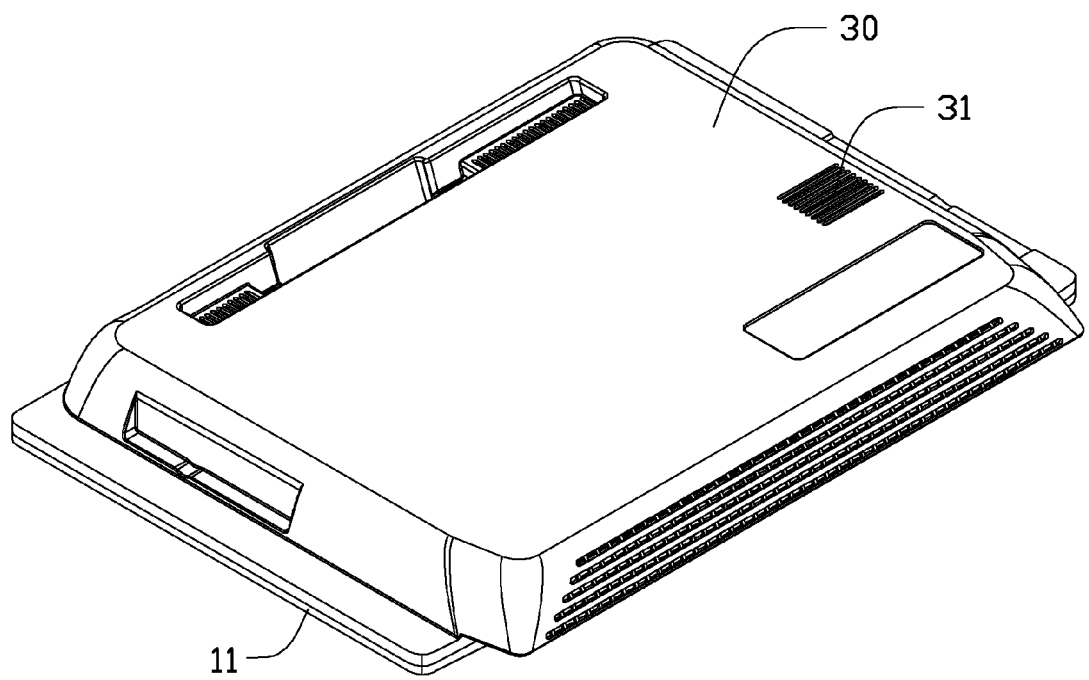
FIG. 5 is an assembled view of FIG. 1.

Referring to FIGS. 1 to 3, in assembly, the air duct 20 is located over the memory cards 131. The first side plate 23 and the third side plate 223 of the air duct 20 contact the bottom panel 121 of the housing 12. The cover 10 is mounted on the computer case 10. At this time, the cover 30 resists the resisting plate 24 of the air duct 20. The first input opening 31 corresponds to the top plate 21 of the air duct 20. The output opening 33 corresponds to the heat sink 136.

In use, air flows into the first input opening 31 and the second input opening 32. Air flows into the air duct 20 to dissipate heat generated by the memory cards 131 via the first holes 211, the second holes 231, the third holes 2211, and the fourth holes 2231. At the same time, air flows to the first heat dissipating device 133 and the second heat dissipating device 135. Finally, air flows to the heat sink 136 by the fan module 137 and flows out of the computer system via the output opening 33.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A computer system comprising:
   a computer case, the computer case comprising a display, a housing connected to the display, a motherboard attached to the housing, and a fan module; the motherboard comprising a heat generating component;
   a cover, a first input opening and an output opening defined in the cover, the output opening corresponding to the fan module; and
   an air duct, the air duct mounted over the heat generating component; a plurality of first holes defined in the air duct corresponding to the heat generating component, the air duct corresponding to the first input opening to guide air to flow to the heat generating component via the first input opening and the plurality of first holes;

wherein the air duct comprises a top plate; the plurality of first holes are defined in the top plate; a space exists between the top plate and the cover; the air duct further comprises a first side plate extending from the top plate, a second side plate extending from the top plate, a connecting plate extending from the second side plate, and a third side plate extending from the connecting plate; the first side plate is substantially perpendicular to the top plate; a plurality of second holes are defined in the first side plate corresponding to the heat generating component; the second side plate is substantially perpendicular to the top plate; a plurality of third holes are defined in the second side plate corresponding to the heat generating component; the connecting plate is substantially perpendicular to the second side plate and the third side plate; and a plurality of fourth holes is defined in the third side plate corresponding to the heat generating component.

2. The computer system of claim 1, wherein the first side plate is substantially perpendicular to the second side plate.

3. The computer system of claim 1, wherein the heat generating component is a memory card, an extending direction of the memory card is substantially parallel to the second side plate.

4. The computer system of claim 1, wherein the top plate is substantially parallel to the motherboard.

5. The computer system of claim 1, wherein the air duct further comprises a resisting plate extending from the top plate, the resisting plate resisting the cover to retain the air duct between the cover and the motherboard.

6. A computer system comprising:
   a computer case, the computer case comprising a display, a housing connected to the display, a motherboard attached to the housing, and a fan module; the motherboard comprising a heat generating component;
   a cover, a first input opening and an output opening defined in the cover, the output opening corresponding to the fan module; and
   an air duct, the air duct comprises a top plate corresponding to the output opening and a resisting plate extending from the top plate; the resisting plate resisting the cover to retain the air duct between the cover and the motherboard; and a space kept between the top plate and the cover;
   a plurality of first holes are defined in the top plate corresponding to the heat generating component; the air duct further comprises a first side plate extending from the top plate, a second side plate extending from the top plate, a connecting plate extending from the second side plate, and a third side plate extending from the connecting plate; the first side plate is substantially perpendicular to the top plate; a plurality of second holes are defined in the first side plate corresponding to the heat generating component; the second side plate is substantially perpendicular to the top plate; and a plurality of third holes are defined in the second side plate corresponding to the heat generating component; the connecting plate is substantially perpendicular to the second side plate and the third side plate; and a plurality of fourth holes is defined in the third side plate corresponding to the heat generating component.

7. The computer system of claim 6, wherein the first side plate is substantially perpendicular to the second side plate.

8. The computer system of claim 6, wherein the heat generating component is a memory card, an extending direction of the memory card is substantially parallel to the second side plate.

9. The computer system of claim 6, wherein the top plate is substantially parallel to the motherboard.

* * * * *